US009971010B2

(12) United States Patent
Lee et al.

(10) Patent No.: US 9,971,010 B2
(45) Date of Patent: May 15, 2018

(54) CALIBRATION APPARATUS AND METHOD FOR NETWORK ANALYZER

(71) Applicant: WITHWAVE CO., LTD., Suwon-si, Gyeonggi-do (KR)

(72) Inventors: Yong Goo Lee, Seoul (KR); Maeng Youl Lee, Seoul (KR); Jeong Il Jeon, Seoul (KR)

(73) Assignee: WITHWAVE CO., LTD., Suwon-si (KR)

( * ) Notice: Subject to any disclaimer, the term of this patent is extended or adjusted under 35 U.S.C. 154(b) by 0 days. days.

(21) Appl. No.: 15/429,703

(22) Filed: Feb. 10, 2017

(65) Prior Publication Data

US 2017/0234959 A1  Aug. 17, 2017

(30) Foreign Application Priority Data

Feb. 16, 2016  (KR) .................. 10-2016-0017653

(51) Int. Cl.
*G01R 35/00* (2006.01)
*G01R 27/28* (2006.01)

(52) U.S. Cl.
CPC ........... *G01R 35/005* (2013.01); *G01R 27/28* (2013.01)

(58) Field of Classification Search
CPC ........ G01R 27/00; G01R 27/28; G01R 31/00; G01R 31/317; G01R 31/3181; G01R 31/319; G01R 31/31903; G01R 31/31908; G01R 31/3191; G01R 31/28; G01R 33/00; G01R 33/0017; G01R 33/0023; G01R 35/00; G01R 35/005; G01R 35/0035; G08B 29/20

USPC ........... 324/600, 601, 74, 130, 202, 750.02; 702/85

See application file for complete search history.

(56) References Cited

U.S. PATENT DOCUMENTS

| 4,553,091 A * | 11/1985 | Bristol ................. G01R 35/002 |
| | | 324/115 |
| 6,701,265 B2 * | 3/2004 | Hill ......................... G01R 27/32 |
| | | 702/91 |

(Continued)

FOREIGN PATENT DOCUMENTS

| JP | 2001-272428 A | 10/2001 |
| KR | 20-0458604 Y1 | 2/2012 |
| KR | 10-2012-0026388 A | 3/2012 |

*Primary Examiner* — Hoai-An D Nguyen
(74) *Attorney, Agent, or Firm* — Stein IP, LLC

(57) ABSTRACT

Disclosed is a calibration apparatus for a network analyzer, including a communication portion configured to communicate with the network analyzer to input or output data necessary for calibration, a signal input portion configured to receive a signal notifying a start of the calibration input, at least one radio frequency (RF) port for being connected to the network analyzer, at least one adaptor configured to connect the RF port with the network analyzer, an impedance circuit portion connected to the RF port and configured to include at least one standard impedance, and a controller portion configured to generate calibration data using adaptor characteristic data corresponding to electrical characteristic of the adaptor, measurement data obtained by connecting each of such standard impedances with the network analyzer, and standard impedance characteristic data corresponding to the standard impedance.

8 Claims, 5 Drawing Sheets

(56) References Cited

U.S. PATENT DOCUMENTS

| | | | |
|---|---|---|---|
| 7,124,049 B2* | 10/2006 | Wong | G01R 27/28 |
| | | | 702/107 |
| 7,769,555 B2* | 8/2010 | Rumiantsev | G01R 35/00 |
| | | | 702/90 |
| 7,961,064 B2* | 6/2011 | Kearns | H01P 5/184 |
| | | | 333/109 |
| 9,121,900 B2* | 9/2015 | Bassin | G01R 31/2889 |
| 2004/0100276 A1* | 5/2004 | Fanton | G01R 35/00 |
| | | | 324/601 |
| 2005/0096860 A1* | 5/2005 | Hillstrom | G01R 27/04 |
| | | | 702/106 |

* cited by examiner

CALIBRATION APPARATUS AND METHOD FOR NETWORK ANALYZER

CROSS-REFERENCE TO RELATED APPLICATION

This application claims priority to and the benefit of Korean Patent Application No. 10-2016-0017653, filed on Feb. 16, 2016, the disclosure of which is incorporated herein by reference in its entirety.

BACKGROUND

1. Field of the Invention

The present invention relates to a calibration apparatus and method for calibration of a network analyzer used for measuring a device under test (DUT).

2. Discussion of Related Art

A signal input to or output from a device under test (DUT) is measured to test the DUT. For example, to test a radio frequency (RF) electronic circuit corresponding to a DUT, it is necessary to measure a reflected and transmitted RF signals through the DUT. To measure such RF signal, a network analyzer is generally used.

However, since an error occurs in the network analyzer depending on time and environment, it is necessary to calibrate the error of the network analyzer before testing the DUT. The error of the network analyzer may be modeled into several items and the modeled error items are calculated using measured data to calibrate the error of the network analyzer, which is called calibration.

A calibration method generally used is calibrating errors of a network analyzer by measuring known impedances instead of the DUT. Here, the known impedances are referred to as a standard impedance. Calibration is performed by applying several error items and at least one standard impedance is necessary for this. Also, a detailed calibration method may vary according to the standard impedance that is used. As standards generally used now, there are Short, Open, Load, Through (SOLT) standards, Through, Reflection, Line (TRL) standards, or Line1, Reflection, Line2 (LRL) standards that are another form of TRL standards. For example, when SOLT standards are used, an operation of connecting to ports of the network analyzer with each of a short impedance, an open impedance, a load impedance, and a thru impedance is needed. That is, a time for connecting standard impedances occupies a considerable part of the entire time of performing calibration.

The invention of collecting standard impedances in one main body to reduce the time of performing calibration may refer to FIG. 1 of Korean Utility Model Registration No. 20-0458604. However, in this case, to perform calibration, it is necessary to manually connect ports of a network analyzer with several standard impedances. The connection between the ports with the standard impedances one by one is a complicated and time consuming works.

To solve this, electrically controlled calibration kits for network analyzers have been developed by network analyzer manufacturers. It may be know through FIG. 1 that the electrically controlled calibration kits each generally include RF ports, a circuit portion including standard impedances, and a communication terminal.

FIG. 1 is a reference view illustrating a conventional calibration kit. Referring to FIG. 1, each of the calibration kits includes a communication terminal 50 for communication with each network analyzer and RF ports 52 for being connected with the RF ports of the network analyzer. All the electrically controlled calibration kits of FIG. 1 have no compatibility with products of other companies than a manufacturer of the network analyzer. This is because an existing subject of performing calibration is the network analyzer and a controller of the network analyzer is in charge of all operation and control functions. Thus, it is a very large weakness that a calibration kit of the same manufacturer as that of the network analyzer should only be used.

Also, since the RF ports of the electrically controlled calibration kit should be the same connector type connectable with RF ports of a DUT to precisely measure the DUT after calibration, it is necessary to use various electrically controlled calibration kits. Accordingly, since a large number of electrically controlled calibration kits having various types of RF ports are necessary, a financial cost occurs.

SUMMARY OF THE INVENTION

It is an aspect of the present invention to provide a general-use calibration apparatus and method for performing calibration with respect to various network analyzers of different manufacturers.

According to an aspect of the present invention, a calibration apparatus for a network analyzer includes a communication portion configured to communicate with the network analyzer to input or output data necessary for calibration, a signal input portion configured to receive a signal notifying a start of the calibration input from a user, at least one radio frequency (RF) port for being connected to the network analyzer, at least one adaptor configured to connect the RF port with the network analyzer, an impedance circuit portion connected to the RF port and configured to include at least one standard impedance, and a controller portion configured to generate calibration data for the calibration of the network analyzer using adaptor characteristic data corresponding to electrical characteristic of the adaptor, measurement data obtained by connecting each of such standard impedances with the network analyzer, and standard impedance characteristic data corresponding to the standard impedance.

The communication portion may support at least one of wired communication including general purpose interface bus (GPIB) communication, communication using a universal serial bus (USB) port communication, RS-232 communication, and local area network (LAN) communication and wireless communication including Bluetooth, wireless fidelity (Wi-Fi), Zigbee, and near field communication (NFC), and beacon communication.

The calibration apparatus may further include at least one external memory card configured to load the adaptor characteristic data of the adaptor and an external memory socket to which the external memory card is connectable.

The controller portion may generate the calibration data by accessing the adaptor characteristic data loaded in the external memory card connected to the external memory socket.

The RF port may include at least one of a coaxial transmission line structure and a waveguide structure.

The impedance circuit portion may include at least one of Short, Open, Load, Through (SOLT) standards, Through, Reflection, Line (TRL) standards, and Line1, Reflection, Line2 (LRL) standards.

The controller portion may transmit the generated calibration data to the network analyzer.

According to another aspect of the present invention, a calibration method using a calibration apparatus for a network analyzer includes receiving and storing, by the calibration apparatus, a calibration initial setting value from the network analyzer, generating, by the calibration apparatus, calibration data for calibration of the network analyzer using measurement data obtained by connecting at least one standard impedance to the network analyzer, adaptor characteristic data corresponding to electrical characteristic of an adaptor, and characteristic data of a standard impedance, and transmitting, by the calibration apparatus, the generated calibration data to the network analyzer.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
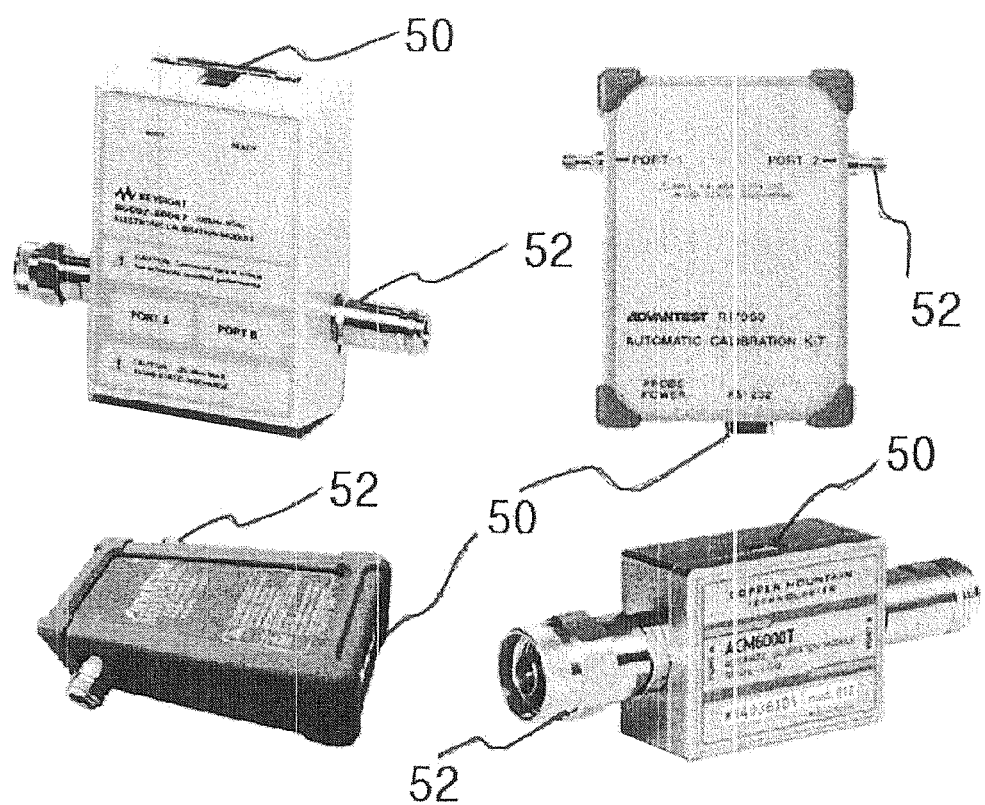
FIG. 1 is a reference view illustrating a conventional electrical calibration kit.

Hereinafter, an exemplary embodiment of the present invention will be described in detail with reference to the attached drawings.

The embodiments of the present invention are provided to more completely explain the present invention to one of ordinary skill in the art. The following embodiments may be modified into various other forms, and the scope of the present invention is not limited thereto. The embodiments are provided to make the disclosure more substantial and complete and to completely convey the concept to those skilled in the art.

The terms used herein are to explain particular embodiments but are not intended to limit the present invention. As used herein, singular forms, unless contextually defined otherwise, may include plural forms. Also, the terms "comprise" and/or "comprising" are used herein to specify the present of stated shapes, numbers, steps, operations, members, elements, and/or groups thereof but not to preclude the presence or addition of one or more other shapes, numbers, operations, members, elements and/or groups thereof. As used herein, the term "and/or" includes any and all combinations or one of a plurality of associated listed items.

The embodiments of the present invention will be described with reference to the drawings which schematically illustrate the embodiments of the present invention. In the drawings, for example, depending on a manufacturing technology and/or tolerance, modifications of illustrated shapes may be expected. Accordingly, it should be understood that the embodiments of the present invention are not limited to particular shapes in areas shown in the specification and may include, for example, changes in shape caused during a manufacturing process.

Hereinafter, components, functions, and operations of a calibration apparatus for a network analyzer according to an exemplary embodiment of the present invention will be described with reference to the attached drawings.

Figure 2:
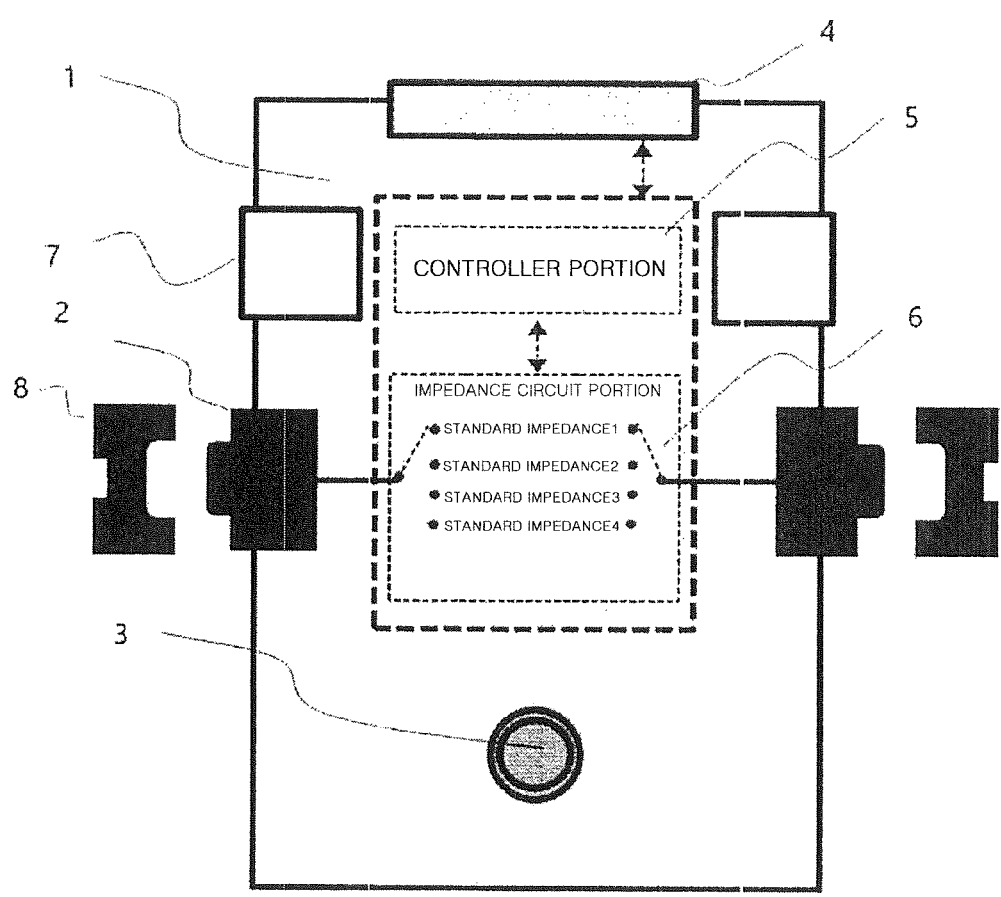
FIG. 2 is a configuration diagram illustrating a calibration apparatus for a network analyzer according to embodiments of the present invention.

FIG. 2 is a configuration diagram illustrating a calibration apparatus for a network analyzer according to embodiments of the present invention.

Referring to FIG. 2, the calibration apparatus according to the embodiments of the present invention may include a main body 1, a radio frequency (RF) port 2, a signal input portion 3, a communication portion 4, a controller portion 5, an impedance circuit portion 6, an external memory card or external memory socket 7, and an adaptor 8.

The main body 1 corresponds to a housing of the calibration apparatus, and it is possible to mount the RF port 2, the signal input portion 3, the communication portion 4, the controller portion 5, the impedance circuit portion 6, and the external memory socket 7.

The RF port 2 is a terminal for being connected to an RF port of a network analyzer. At least one of such RF port 2 may be provided, and a plurality thereof may be used input and/or output ports. The RF port 2 described above may include at least one of a coaxial transmission line structure and a waveguide structure.

The signal input portion 3 is a user interface (UI) capable of receiving a user command for notifying a start of calibration from a user. For example, the signal input portion 30 may correspond to an input switch, an input button, an input key, an input touch pad and the like for starting calibration.

The communication portion 4 supports a communication function for transmitting and receiving data according to executing calibration with the network analyzer. That is, the communication portion 4 communicates with the network analyzer to input and output data necessary for calibration. For this, the communication portion 4 may include communication modules for supporting wired communication or wireless communication. For example, the communication portion 4 may support wired communication such as general purpose interface bus (GPIB) communication, communication using a universe serial bus (USB) port communication, RS-232 communication, local area network (LAN) communication or the like. Also, the communication portion 4 may support wireless communication such as Bluetooth, wireless fidelity (Wi-Fi), Zigbee, and near field communication (NFC), beacon communication and the like as local area communication.

The controller portion 5 performs a calibration operation (for example, an operation function, a control function, and a memory function) using at least one measurement data obtained by connecting each of standard impedances with the network analyzer through control of the impedance circuit portion 6 and at least one standard impedance characteristic data with respect to the standard impedances of the impedance circuit portion 6, and generates calibration data through this. Here, the controller portion 5 sets a calibration range according to a calibration initial setting value provided from the network analyzer.

Also, the controller portion 5 may generate the calibration data using at least one adaptor characteristic data corresponding to electrical characteristics of at least one the adaptor 8 in addition to the measurement data measured through control of the impedance circuit portion 6 and the standard impedance characteristic data. That is, the controller portion 5 may generate the calibration data using the measurement data of each of the standard impedances of the impedance circuit portion 6, the adaptor characteristic data with respect to the adaptor 8, and the standard impedance characteristic data loaded in the controller portion 5 or provided from the network analyzer. For this, the controller portion 5 may include an internal memory for loading the measurement data, the calibration initial setting value, the adaptor characteristic data, and the standard impedance characteristic data.

As data obtained by measuring a DUT in a correction off state of the network analyzer, data including error data of the network analyzer and characteristic data of the DUT is measured. Also, in a correction on state of the network analyzer, DUT characteristic data obtained by removing the network analyzer error data from the measurement data in the correction off state is indicated. An accuracy degree of the measured DUT characteristic data depends on the number of pieces of the error data used in the correction on state and an accuracy degree of each piece of the error data. Meanwhile, the calibration at the controller portion 5 according to the embodiments of the present invention is a process of calculating an error data value of the network analyzer. There may be present 12-error data based on 2-port network. For example, the 12-error data may include forward directivity, forward reflection tracking, forward transmission tracking, forward source mismatch, forward load mismatch, forward isolation, reverse directivity, reverse reflection tracking, reverse transmission tracking, reverse source mismatch, reverse load mismatch, and reverse isolation.

In the process of generating the calibration data by the controller portion 5, the error data of the network analyzer is calculated by cascade scattering parameter operation using the measurement data obtained by measuring one or more standard impedances and the standard impedance characteristic data. The standard impedance data used for the processing operation is new standard impedance characteristic data obtained by combining the adaptor characteristic data with the standard impedance characteristic data of the impedance circuit portion 6. Here, all the data used herein are scattering parameter.

The controller portion 5 transmits the generated calibration data to the network analyzer through the communication portion 4.

The impedance circuit portion 6 includes a plurality of standard impedances including Short, Open, Load, Through (SOLT) standards, Through, Reflection, Line (TRL) standards, or Line1, Reflection, Line2 (LRL) standards. Also, the impedance circuit portion 6 may include switching modules for connecting any one of the standard impedances with the RF port 2. Accordingly, the impedance circuit portion 6 connects any one of a plurality of such standard impedances with the RF port 2 according to switching control signals of the switching modules provided from the controller portion 5.

The external memory card 7 loads the adaptor characteristic data corresponding to electrical characteristic of the adaptor 8. Also, the external memory socket 7 is an external memory connection terminal into which the external memory card 7 is insertable. Here, the adaptor characteristic data includes a scattering parameter or calibration information that indicates own electrical characteristic of the adaptor 8. At least one of the external memory card 7 and external memory socket 7 may be provided, and the number of such external memory cards 7 and external memory sockets 7 may be the same number as that of RF ports 2. Meanwhile, the controller portion 5 may generate the calibration data by accessing the adaptor characteristic data loaded in the external memory card 7 inserted in the external memory socket.

The adaptor 8 performs a connector function for connecting the RF port 2 with the RF port of the network analyzer. One end of the adaptor 8 may have a connector type capable of being combined with the RF port 2, and the other end of the adaptor 8 may have a connector type capable of being combined with a RF port of the network analyzer. The adaptor 8 may have a coaxial structure or a waveguide structure. At least one of such adaptor 8 may be included, and the number of such adaptors 8 may be the same number as that of RF ports 2. Also, considering that the external memory card 7 loads the adaptor characteristic data of the adaptor 8, the number of such adaptors 8 may be a number corresponding to the number of external memory cards 7.

Figure 3:
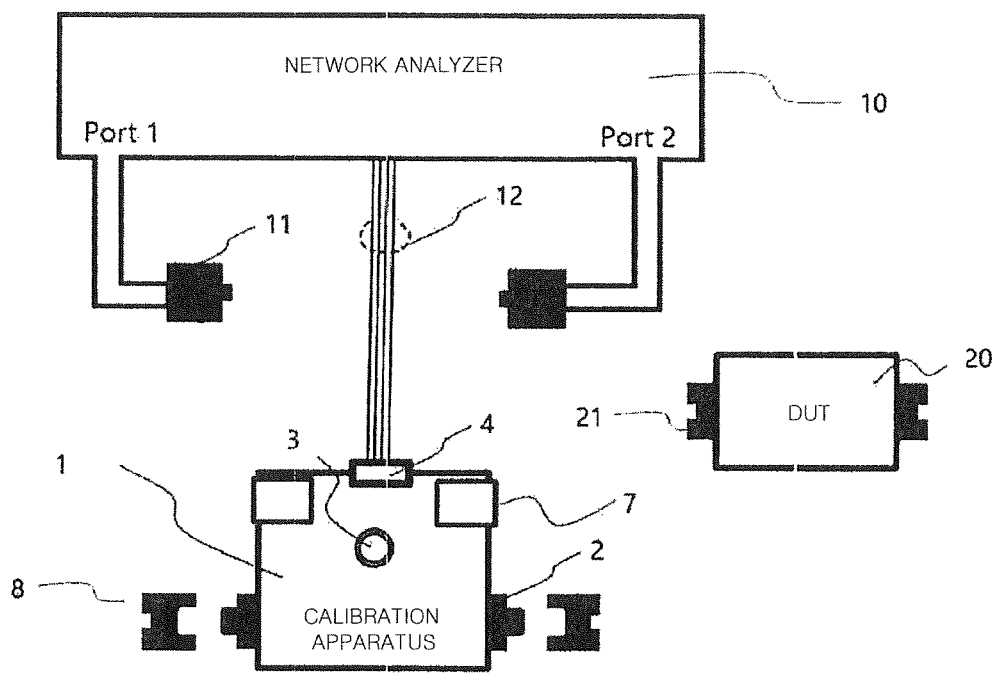
FIG. 3 is a reference view illustrating one embodiment of a connection between the calibration apparatus for the network analyzer and the network analyzer according to embodiments of the present invention shown in FIG. 2.
Figure 4:
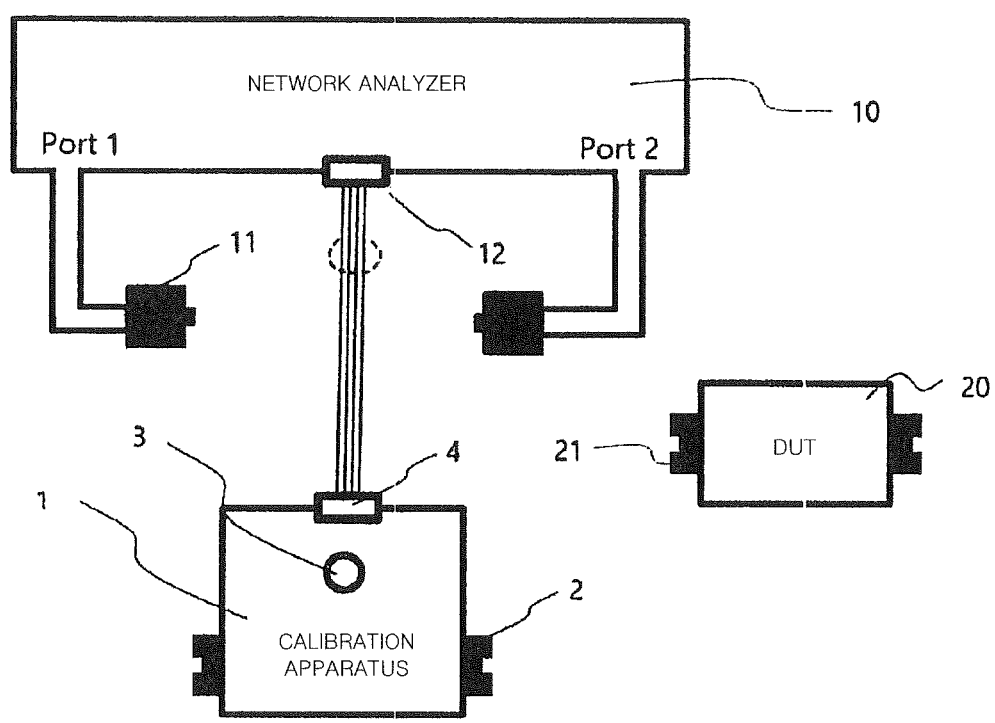
FIG. 4 is a reference view illustrating another embodiment of a connection between the calibration apparatus for the network analyzer and the network analyzer according to embodiments of the present invention shown in FIG. 2.

FIG. 3 is a reference view illustrating one embodiment of a connection between the calibration apparatus for the network analyzer and the network analyzer according to embodiments of the present invention shown in FIG. 2, and FIG. 4 is a reference view illustrating another embodiment of a connection between the calibration apparatus for the network analyzer and the network analyzer according to embodiments of the present invention shown in FIG. 2.

Generally, to measure a DUT 20, a network analyzer 10 connects an RF port 11 with a terminal 21 of the DUT 20. Here, to precisely measure the DUT 20 using the network analyzer 10, a calibration process with respect to the network analyzer 10 is necessary before measuring the DUT 20. FIGS. 3 and 4 illustrate a connection between devices for calibrating errors of a system of the network analyzer 10, a transmission line, a connection terminal and the like before measuring the DUT 20.

Referring to FIGS. 3 and 4, the communication portion 4 of the calibration apparatus is connected to a communication terminal 12 of the network analyzer 10 and the RF port 11 of the network analyzer 10 is connected to the RF port 2 of the calibration apparatus.

A method of connecting the RF port 11 of the network analyzer 10 with the RF port 2 of the calibration apparatus, as shown in FIG. 3, may include connecting the RF port 11 of the network analyzer 10 with the RF port 2 of the calibration apparatus with the adaptor 8 therebetween or directly connecting the RF port 11 of the network analyzer 10 with the RF port 2 of the calibration apparatus, as shown in FIG. 4. When using the adaptor 8, adaptor characteristic data loaded in the external memory card 7 is used.

Figure 5:
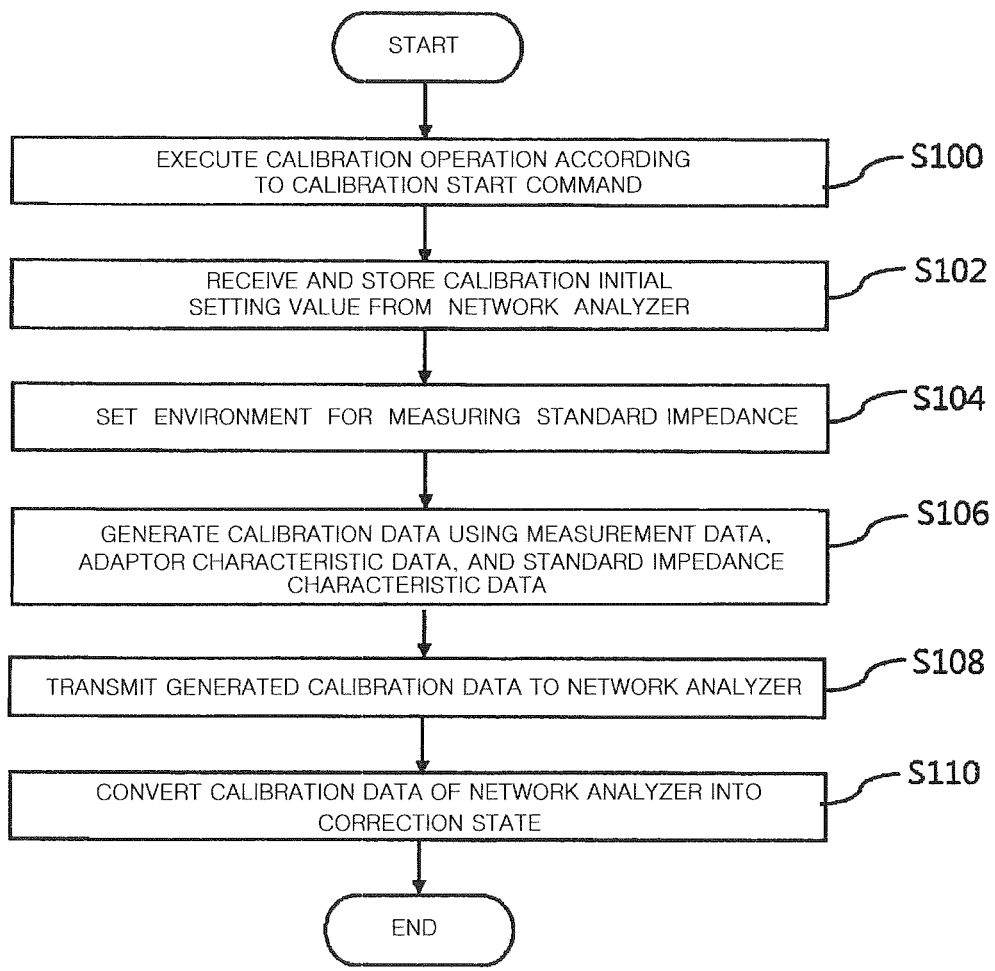
FIG. 5 is a flowchart illustrating one embodiment of a calibration method using a calibration apparatus for a network analyzer according to embodiments of the present invention.

FIG. 5 is a flowchart illustrating one embodiment of a calibration method using a calibration apparatus for a network analyzer according to embodiments of the present invention.

The communication portion 4 of the calibration apparatus is connected to the communication terminal 12 of the network analyzer, the RF port 11 of the network analyzer is connected to the RF port 2 of the calibration apparatus, and then the calibration apparatus receives a calibration start command through the signal input portion 3 and operates a calibration operation (S100).

After operation S100, the calibration apparatus receives a calibration initial setting value necessary for measuring the DUT 20 from the network analyzer 10 and stores the received initial setting value in an internal memory of the controller portion 5 (S102). The calibration apparatus sets a calibration range according to the calibration initial setting value.

After operation S102, the calibration apparatus sets an environment for measuring standard impedances in a correction off state of the network analyzer 10, that is, a state without calibration applied thereto (S104).

After operation S104, the calibration apparatus performs a calibration operation using the at least one measurement data obtained by connecting each of the standard impedances to the network analyzer 10, the at least one standard impedance characteristic data corresponding to the standard impedances loaded in the controller portion or provided from the network analyzer 10, and the at least one adaptor characteristic data loaded in an internal memory or an external memory card in such a way that the network analyzer 10 generates calibration data necessary for applying calibration (S106).

After operation S106, the calibration apparatus transmits the calibration data necessary for applying calibration to the network analyzer 10 through the communication portion 4 (S108).

After operation S108, the network analyzer 10 loads the calibration data transmitted from the calibration apparatus in a calibration data storage memory, is changed into correction on state, and then finishes the calibration operation (S110).

Each of the methods according to embodiments of the present invention may be embodied as a program instruction executable through various computer means and may be recorded in a computer-readable medium. The computer-readable medium may include one or a combination of a program instruction, a data file, a data structure and the like. The program instruction recorded in the computer-readable medium may be particularly designed and configured for the present invention or may be well-known to those skilled in the art with respect to computer software to be available.

The computer-readable medium, for example, includes a hardware device particularly configured to store and perform a program instruction, such as a read-only memory (ROM), a random-access memory, a flash memory and the like. The program instruction, for example, includes not only a machine language code manufactured by a compiler but also a high-level language code executable by a computer using an interpreter and the like. The hardware device described above may be configured to operate as at least one software module for performing the operations of the present invention and an inverse thereof is available.

According to the embodiments of the present invention, since a calibration apparatus has a controller configured to control operations and perform a memory function, compatibility among pieces of equipment that are not included in a calibration kit may be overcome and calibration may be performed for each of network analyzers of different manufacturers.

Also, according to the embodiments of the present invention, since the calibration apparatus includes an external memory card built therein and employs an adaptor for combination, it is unnecessary to include a high-priced electrically controlled calibration kit for each type of RF ports and an economical effect may be obtained.

Although the embodiments of the present disclosure have been described above, it should be appreciated by those skilled in the art that various changes and modifications may be made in these embodiments without departing from the concept and scope of the present invention defined in the following claims.

What is claimed is:

1. A calibration apparatus for a network analyzer, comprising:

a communication portion configured to communicate with the network analyzer to input or output data necessary for calibration;
a signal input portion configured to receive a signal notifying a start of the calibration input from a user;
at least one radio frequency (RF) port for being connected to the network analyzer;
at least one adaptor configured to connect the RF port with the network analyzer;
an impedance circuit portion connected to the RF port and configured to comprise at least one standard impedance; and
a controller portion configured to generate calibration data for the calibration of the network analyzer using adaptor characteristic data corresponding to electrical characteristic of the adaptor, measurement data obtained by connecting each of such standard impedances with the network analyzer, and standard impedance characteristic data corresponding to the standard impedance.

2. The calibration apparatus of claim 1, wherein the communication portion supports at least one of wired communication including general purpose interface bus (GPIB) communication, communication using a universe serial bus (USB) port communication, RS-232 communication, and local area network (LAN) communication and wireless communication including Bluetooth, wireless fidelity (Wi-Fi), Zigbee, and near field communication (NFC), and beacon communication.

3. The calibration apparatus of claim 1, further comprising:
at least one external memory card configured to load the adaptor characteristic data of the adaptor; and
an external memory socket to which the external memory card is connectable.

4. The calibration apparatus of claim 3, wherein the controller portion generates the calibration data by accessing the adaptor characteristic data stored in the external memory card connected to the external memory socket.

5. The calibration apparatus of claim 1, wherein the RF port comprises at least one of a coaxial transmission line structure and a waveguide structure.

6. The calibration apparatus of claim 1, wherein the impedance circuit portion comprises at least one of Short, Open, Load, Through (SOLT) standards, Through, Reflection, Line (TRL) standards, and Line1, Reflection, Line2 (LRL) standards.

7. The calibration apparatus of claim 1, wherein the controller portion transmits the generated calibration data to the network analyzer.

8. A calibration method using a calibration apparatus for a network analyzer, comprising:
receiving and storing, by the calibration apparatus, a calibration initial setting value from the network analyzer;
generating, by the calibration apparatus, calibration data for calibration of the network analyzer using measurement data obtained by connecting at least one standard impedance to the network analyzer, adaptor characteristic data corresponding to electrical characteristic of an adaptor, and characteristic data of the standard impedance; and
transmitting, by the calibration apparatus, the generated calibration data to the network analyzer.

* * * * *